United States Patent
Hu et al.

(10) Patent No.: US 9,658,284 B2
(45) Date of Patent: May 23, 2017

(54) METHOD FOR FORMING A TEST PAD AND METHOD FOR PERFORMING ARRAY TEST USING THE TEST PAD

(71) Applicant: Shenzhen China Star Optoelectronics Technology Co., Ltd., Shenzhen, Guangdong (CN)

(72) Inventors: Yutong Hu, Guangdong (CN); Peng Du, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 340 days.

(21) Appl. No.: 14/423,113

(22) PCT Filed: Jan. 6, 2015

(86) PCT No.: PCT/CN2015/070204
§ 371 (c)(1),
(2) Date: Feb. 21, 2015

(87) PCT Pub. No.: WO2016/090718
PCT Pub. Date: Jun. 16, 2016

(65) Prior Publication Data
US 2016/0341789 A1 Nov. 24, 2016

(30) Foreign Application Priority Data
Dec. 10, 2014 (CN) .......................... 2014 1 0757792

(51) Int. Cl.
*G01R 31/28* (2006.01)
*H01L 21/66* (2006.01)
(Continued)

(52) U.S. Cl.
CPC ......... *G01R 31/2884* (2013.01); *G01R 31/28* (2013.01); *H01L 21/77* (2013.01);
(Continued)

(58) Field of Classification Search
CPC ..... G01R 31/2884; H01L 21/77; H01L 22/32; H01L 27/12; H01L 29/78672
(Continued)

(56) References Cited

U.S. PATENT DOCUMENTS

2012/0305917 A1* 12/2012 Yoko ...................... G11C 5/063
257/48

FOREIGN PATENT DOCUMENTS

CN      CN101295720 A    10/2008
CN      CN103377961 A    10/2013

OTHER PUBLICATIONS

Chen et al., CN103377961A, 2013, Machine Translation, p. 1-18.*
Huang et al., CN 101295720A, 2008, Machine Translation, p. 1-16.*
ISA PCT Written Opinion, PTO Translation, 2017, p. 1-9.*

* cited by examiner

*Primary Examiner* — Thomas Valone
(74) *Attorney, Agent, or Firm* — Andrew C. Cheng

(57) ABSTRACT

The disclosure is related to a method for forming a test pad between adjacent transistors regions, comprising forming a plurality of transistor regions in an array on a glass substrate, wherein each of the transistor region comprises a first transistor region and a second transistor region arranged oppositely; and forming a plurality of test pads between the first transistor region and the second transistor region. The disclosure is further related to a method for array test on the adjacent transistor regions using the test pad formed by the above method. A common test pad formed between the adjacent transistor regions of each transistor region group is employed by the disclosure to perform array test on the adjacent transistor regions. Thus the size of the adjacent fringe region of each transistor region may be reduced to facilitate achieving narrow frame of a display.

13 Claims, 2 Drawing Sheets

(51) Int. Cl.
*H01L 21/77* (2017.01)
*H01L 27/12* (2006.01)
*H01L 29/786* (2006.01)

(52) U.S. Cl.
CPC .............. *H01L 22/32* (2013.01); *H01L 27/12* (2013.01); *H01L 29/78672* (2013.01)

(58) Field of Classification Search
USPC ...................................................... 324/750.3
See application file for complete search history.

METHOD FOR FORMING A TEST PAD AND METHOD FOR PERFORMING ARRAY TEST USING THE TEST PAD

BACKGROUND

Technical Field

The disclosure is related to display technology field, and more particular to a method for forming a test pad between adjacent transistor regions and a method for performing array test on the adjacent transistor regions using the pad formed by the method.

Related Art

Among displays with small size and high resolution, it is known to the public that LTPS (Low Temperature Poly-Silicon) technology has been widely adopted due to the high mobility and stability. However, the low yield rate for LTPS displays has greatly perplexed the panel manufactures. In this respect, the array test is a necessary and prompt approach to monitor each manufacturing process.

Along with the rapid development of the mobile phone market, the parameters for mobile phones have become increasingly demanding. Among the parameters, the image resolution and narrow frame are two advertised features by the mobile phone companies. In order to efficiently find the problem more clearly, the array test is fine enough to detect each pixel. In order to satisfy the array test on the display having high image resolution, the manufactures generally adopt De-Mux to increase the efficiency. However, due to the manufacture process and the machine precision, the required height for the De-Mux and the test pad become obstacles to achieve narrow frame of a display. For example, in the current technology, all of the transistor regions on each glass substrate are arranged in the same direction. That is an adjacent fringe region at one side of each transistor region is arranged with a test pad. The occupied area is greater and it does not facilitate to achieve narrow frame of a display.

SUMMARY

In order to solve the problem existing in the current technology, one embodiment of the disclosure provides a method for forming a test pad between adjacent transistor regions, comprising: forming a plurality of transistor regions in an array on a glass substrate, wherein each of the transistor region comprises a first transistor region and a second transistor region arranged oppositely; and forming a plurality of test pads between the first transistor region and the second transistor region.

In one embodiment, before the step of forming a plurality of test pads between the first transistor region and the second transistor region, the method further comprises a step of forming a plurality of field-effect transistors at the adjacent fringe region of the first transistor region and forming a plurality of field-effect transistors at the adjacent fringe region of the second transistor region.

In one embodiment, the gate terminals of the plurality of field-effect transistors formed on the adjacent fringe region of the first transistor region connect to one of the plurality of test pads, and the gate terminals of the plurality of field-effect transistors formed on the adjacent fringe region of the second transistor region connect to another of the plurality of test pads.

In one embodiment, the number of the field-effect transistors is equivalent to the number of the data line of the first transistor region and the number of the data line of the second transistor region.

In one embodiment, the method further comprises a step of forming an outer lead bonding region at the fringe region of the first transistor region far from the second transistor region, and forming an outer lead bonding region at the fringe region of the second transistor region far from the first transistor region.

In one embodiment, the difference between the number of the test pads and the number of the data line of the first transistor region or the second transistor region is at least two, the number of the test pads is greater than the number of the data line of the first transistor region or the second transistor region.

In one embodiment, the first transistor region and the second transistor region comprise a plurality of field-effect transistors arranged in an array.

In one embodiment, the field-effect transistor is a thin film transistor.

Another embodiment of the disclosure provides a method for array test on the adjacent transistor regions using the test pad formed by the above method, comprising steps of: providing a high voltage level signal to one of the test pads, and a low voltage level signal to another of the test pads to perform array test on the first transistor region; and providing a low voltage level signal to one of the test pads, and a high voltage level signal to another of the test pads to perform array test on the second transistor region.

Yet another embodiment of the disclosure provides a method for array test on the adjacent transistor regions using the test pad formed by the above method, comprising steps of: providing a low voltage level signal to one of the test pads, and a high voltage level signal to another of the test pads to perform array test on the second transistor region; and providing a high voltage level signal to one of the test pads, and a low voltage level signal to another of the test pads to perform array test on the first transistor region.

The disclosure adopts a common test pad formed between the adjacent transistor regions of each transistor region group to perform array test on the adjacent transistor regions. Thus the size of the adjacent fringe region of each transistor region may be reduced to facilitate achieving narrow frame of a display.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

The following description with reference to the accompanying drawings is provided to explain the exemplary embodiments of the disclosure. It will be apparent, however, that the disclosure may be practiced by one or more embodiments, and the specific embodiments provided herein cannot be interpreted to limit the disclosure. On the contrary, those embodiments are provided to explain the principle and the application of the disclosure such that those skilled in the art may understand the various embodiments of the disclosure and the various modifications for specific expected application.

Figure 1:
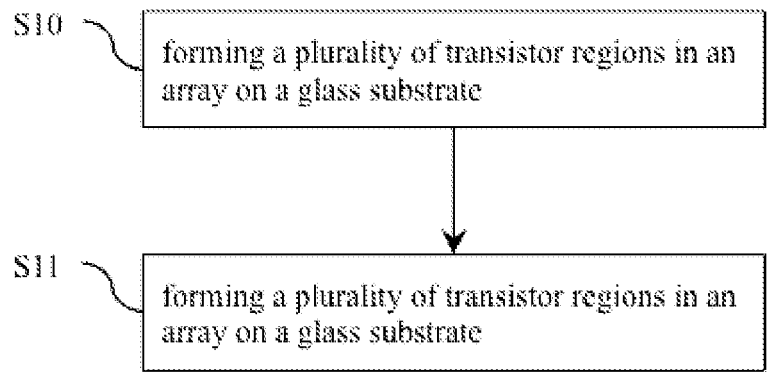
FIG. 1 is the flow chart of the method for forming a test pad between adjacent transistors according to one embodiment of the present disclosure.
Figure 2:
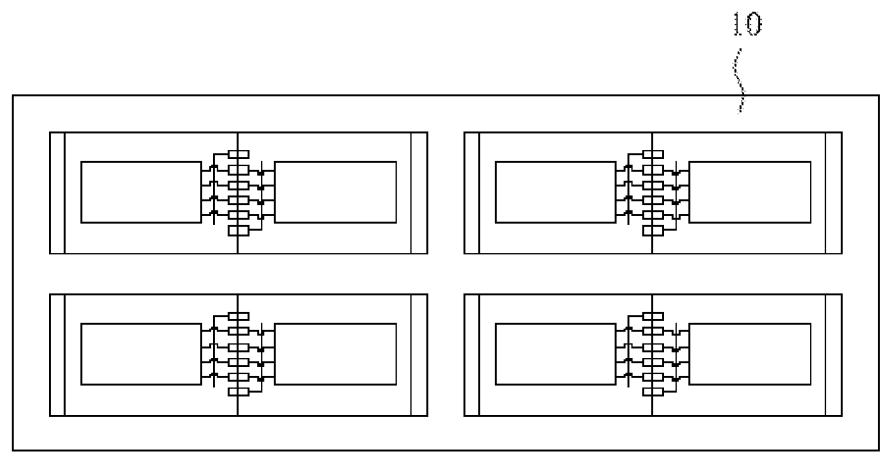
FIG. 2 illustrates the top view of forming a plurality of transistor regions in an array on the glass substrate and forming a test pad between the adjacent transistor regions according to one embodiment of the disclosure.
Figure 3:
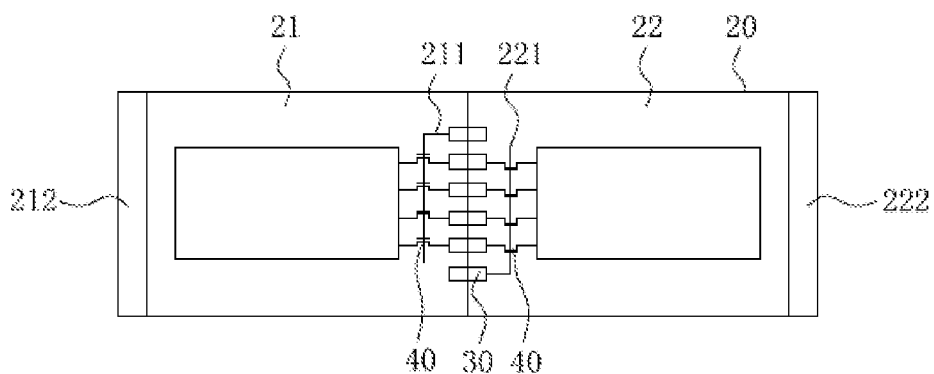
FIG. 3 illustrates the top view of one transistor region according to one embodiment of the disclosure.

FIG. 1 is the flow chart of the method for forming a test pad between the adjacent transistor regions according to one embodiment of the disclosure. FIG. 2 illustrates the top view of forming a plurality of transistor regions in an array on the glass substrate and forming a test pad between the adjacent transistor regions according to one embodiment of the disclosure. FIG. 3 illustrates the top view of one transistor region according to one embodiment of the disclosure.

Referee to FIG. 1, FIG. 2 and FIG. 3, the method for forming a test pad between adjacent transistors regions according to one embodiment of the disclosure comprises steps of:

Step S10: forming a plurality of transistor regions 20 in an array on a glass substrate 10, wherein each of the transistor region 20 comprises a first transistor region 21 and a second transistor region 22 arranged oppositely.

In Step 10, the area of the glass substrate 10 is much greater than that of the first transistor region 21 or that of the second transistor region 22. In the subsequent manufacturing process, it requires cutting the glass substrate 10. After cutting, the first transistor region 21 and the glass substrate carrying the first transistor region 21, or the second transistor region 22 and the glass substrate carrying the second transistor region 22 is referred as an array substrate.

Furthermore, both of the first transistor region 21 and the second transistor region 22 comprise a plurality of field-effect transistors 40 arranged in an array. In this embodiment, the field-effect transistor 40 is a thin film transistor.

Step S11: forming a plurality of test pads 30 between the first transistor region 21 and the second transistor region 22. In this embodiment, in the step S11, the central portion of each test pad is arranged on the cutting line. Besides, the difference between the number of the test pads 30 and the number of the data line of the first transistor region 21 or the number of the second transistor region 22 is at least two; the number of the test pads is greater than the number of the data line of the first transistor region 21 or the number of the data line of the second transistor region 22.

Besides, before the step S11, the method further comprises a step of forming a plurality of field-effect transistors 40 at the adjacent fringe region 211 of the first transistor region 21 and forming a plurality of field-effect transistors 40 at the adjacent fringe region 221 of the second transistor region 22. Herein, the adjacent fringe region 211 of the first transistor region 21 indicates a region of the first transistor region 21 adjacent to the second transistor region 22, and the adjacent fringe region 221 of the second transistor region 22 indicates a region of the second transistor region 22 adjacent to the first transistor region 21.

The number of the field-effect transistors 40 in the adjacent fringe region 211 of the first transistor region 21 is equivalent to the number of the data line of the first transistor region 21 or the number of the data line of the second transistor region 22. The number of the field-effect transistors 40 in the adjacent fringe region 221 of the second transistor region 22 is equivalent to the number of the data line of the first transistor region 21 or the number of the data line of the second transistor region 22.

Besides, the gate terminals of the plurality of field-effect transistors 40 formed on the adjacent fringe region 211 of the first transistor region 21 connect to one of the plurality of test pads 30, and the gate terminals of the plurality of field-effect transistors 40 formed on the adjacent fringe region 221 of the second transistor region 22 connect to another of the plurality of test pads 30.

Furthermore, an outer lead bonding (OLB) region 212 is formed at the fringe region of the first transistor region 21 far from the second transistor region 22, and an outer lead bonding (OLB) region 222 is formed at the fringe region of the second transistor region 22 far from the first transistor region 21.

Figure 4:
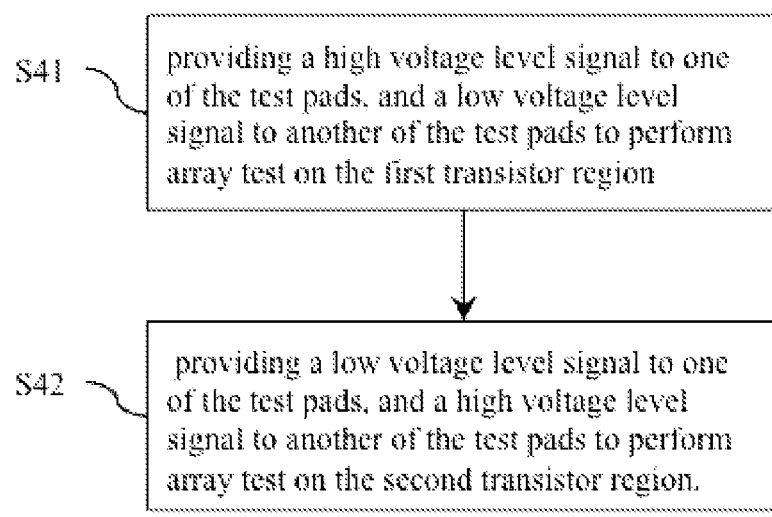
FIG. 4 is the flow chart for the method of performing array test on the adjacent transistor regions using the test pads formed by the method of FIG. 1 according to the embodiment of the disclosure.

FIG. 4 is the flow chart for the method of performing array test on the adjacent transistor regions using the test pads formed by the method of FIG. 1 according to the embodiment of the disclosure.

Refer to FIG. 4, the method of performing array test on the adjacent transistor regions using the test pads formed by the method of FIG. 1 according to the embodiment of the disclosure comprises steps of:

Step S41: providing a high voltage level signal to one of the test pads 30, and a low voltage level signal to another of the test pads 30 to perform array test on the first transistor region 21;

Step S42: providing a low voltage level signal to one of the test pads 30, and a high voltage level signal to another of the test pads 30 to perform array test on the second transistor region.

Besides, the array test on the first transistor region 21 or the second transistor 22 is known to those skilled in the art and thus the description is omitted.

Furthermore, in another embodiment of the disclosure, the step S42 may be performed first and then the step S41 is performed.

In summary, according to the embodiment, a common test pad formed between the adjacent transistor regions of each transistor region group is employed by the disclosure to perform array test on the adjacent transistor regions. Thus the size of the adjacent fringe region of each transistor region may be reduced to facilitate achieving narrow frame of a display.

Although the present disclosure is illustrated and described with reference to specific embodiments, those skilled in the art will understand that many variations and modifications are readily attainable without departing from the spirit and scope thereof as defined by the appended claims and their legal equivalents.

What is claimed is:

1. A method for forming a test pad between adjacent transistors regions, comprising:
    forming a plurality of transistor regions in an array on a glass substrate, wherein each of the transistor region comprises a first transistor region and a second transistor region arranged oppositely; and
    forming a plurality of test pads between the first transistor region and the second transistor region.

2. The method according to claim 1, wherein before the step of forming a plurality of test pads between the first transistor region and the second transistor region, further comprising forming a plurality of field-effect transistors at the adjacent fringe region of the first transistor region and forming a plurality of field-effect transistors at the adjacent fringe region of the second transistor region.

3. The method according to claim 2, wherein the gate terminals of the plurality of field-effect transistors formed on the adjacent fringe region of the first transistor region connect to one of the plurality of test pads, and the gate terminals of the plurality of field-effect transistors formed on the adjacent fringe region of the second transistor region connect to another of the plurality of test pads.

4. The method according to claim 2, wherein the number of the field-effect transistors is equivalent to the number of the data line of the first transistor region and the number of the data line of the second transistor region.

5. The method according to claim 1, further comprising a step of forming an outer lead bonding region at the fringe region of the first transistor region far from the second transistor region, and forming an outer lead bonding region at the fringe region of the second transistor region far from the first transistor region.

6. The method according to claim 2, further comprising a step of forming an outer lead line connection region at the first transistor region far from the fringe region of the second transistor region, and forming an outer lead line connection region at the second transistor region far from the fringe region of the first transistor region.

7. The method according to claim 1, wherein the difference between the number of the test pads and the number of the data line of the first transistor region or the second transistor region is at least two, and the number of the test pads is greater than the number of the data line of the first transistor region or the second transistor region.

8. The method according to claim 2, wherein the difference between the number of the test pads and the number of the data line of the first transistor region or the second transistor region is at least two, and the number of the test pads is greater than the number of the data line of the first transistor region or the second transistor region.

9. The method according to claim 1, wherein the first transistor region and the second transistor region comprise a plurality of field-effect transistors arranged in an array.

10. The method according to claim 2, wherein the field-effect transistor is a thin film transistor.

11. The method according to claim 9, wherein the field-effect transistor is a thin film transistor.

12. A method for array test on the adjacent transistor regions using the test pad formed by the method of claim 1, comprising:
    providing a high voltage level signal to one of the test pads, and a low voltage level signal to another of the test pads to perform array test on the first transistor region; and
    providing a low voltage level signal to one of the test pads, and a high voltage level signal to another of the test pads to perform array test on the second transistor region.

13. A method for array test on the adjacent transistor regions using the test pad formed by the method of claim 1, comprising:
    providing a low voltage level signal to one of the test pads, and a high voltage level signal to another of the test pads to perform array test on the second transistor region; and
    providing a high voltage level signal to one of the test pads, and a low voltage level signal to another of the test pads to perform array test on the first transistor region.

* * * * *